(12) United States Patent
Kong et al.

(10) Patent No.: US 10,719,139 B2
(45) Date of Patent: Jul. 21, 2020

(54) SENSING SYSTEM AND METHOD FOR IMPROVING CONTROL OF A SENSOR DETECTION VALUE

(71) Applicants: Hyundai Motor Company, Seoul (KR); Kia Motors Corporation, Seoul (KR)

(72) Inventors: Hun Kong, Gyeonggi-do (KR); Seong Han Kim, Gyeonggi-Do (KR); Gun Soo Kang, Gyeonggi-Do (KR); Sang Hoon Kwak, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 149 days.

(21) Appl. No.: 15/827,919

(22) Filed: Nov. 30, 2017

(65) Prior Publication Data
US 2018/0348892 A1 Dec. 6, 2018

(30) Foreign Application Priority Data
Jun. 1, 2017 (KR) .................. 10-2017-0068283

(51) Int. Cl.
*G01R 1/30* (2006.01)
*G06F 3/03* (2006.01)
(Continued)

(52) U.S. Cl.
CPC ....... *G06F 3/0304* (2013.01); *G01D 5/24428* (2013.01); *G01K 7/01* (2013.01);
(Continued)

(58) Field of Classification Search
CPC .... G01D 5/24428; G06F 3/0304; G01K 7/01; G01R 19/04; G01R 19/2506; G01R 1/30;
(Continued)

(56) References Cited

U.S. PATENT DOCUMENTS

| 6,828,770 | B1 * | 12/2004 | McCauley | ......... G01R 19/2506 |
| | | | | 324/117 R |
| 7,425,821 | B2 * | 9/2008 | Monreal | .................. G01D 3/02 |
| | | | | 324/117 H |

(Continued)

FOREIGN PATENT DOCUMENTS

| EP | 2623996 A1 | 8/2013 |
| KR | 2009-0009344 A | 1/2009 |

OTHER PUBLICATIONS

Extended European Search Report for European Patent Application No. EP17205523, dated Apr. 20, 2018, 11 pages.
(Continued)

*Primary Examiner* — Suman K Nath
(74) *Attorney, Agent, or Firm* — Mintz Levin Cohn Ferris Glovsky and Popeo, P.C.; Peter F. Corless

(57) ABSTRACT

A sensing system and method are provided. The sensing system includes a sensor unit that is configured to output a voltage having a magnitude that corresponds to a detected physical quantity and an amplification unit that is configured to amplify a magnitude in the output of the sensor unit to a constant gain. An offset removal unit is configured to remove a direct current (DC) offset from an output amplified by the amplification unit to generate a first detection signal. An inversion circuit unit is configured to invert the first detection signal to generate a second detection signal. A microcomputer is configured to then calculate the physical quantity detected by the sensor unit based on the first detection signal and the second detection signal.

4 Claims, 6 Drawing Sheets

(51) Int. Cl.
*G01R 19/04* (2006.01)
*G01R 19/25* (2006.01)
*G01D 5/244* (2006.01)
*G01K 7/01* (2006.01)
*G01P 1/00* (2006.01)
*H04N 5/20* (2006.01)

(52) U.S. Cl.
CPC .............. *G01P 1/006* (2013.01); *G01R 1/30* (2013.01); *G01R 19/04* (2013.01); *G01R 19/2506* (2013.01); *H04N 5/20* (2013.01)

(58) Field of Classification Search
CPC ......... G01R 19/22; G01R 19/25; G01P 1/006; H04N 5/20
USPC .............................. 73/862.625–862.628, 795
See application file for complete search history.

(56) References Cited

U.S. PATENT DOCUMENTS

2012/0147922 A1* 6/2012 Lau .................. H03F 3/387
374/152
2012/0190131 A1* 7/2012 Novotny .............. G01N 29/022
436/501
2015/0077579 A1* 3/2015 Uemura ................ H03F 1/0277
348/208.4

OTHER PUBLICATIONS

Carter, Bruce, "Buffer Op Amp to ADC Circuit Collection", Texas Instruments, Mar. 3, 3013, XPG55469117, Oxford ISBN: 978-0-12-391495-8, http://www.ti.com/lit/an/sloa098/sloa098.pdf, retrieved on Apr. 19, 2018, paragraphs [03.2], [03.5], [04.5], [04.6], figures 4, 6, 17, 20.
Paterson, Sally, "Maximize performance when driving differential ADCs", Jun. 12, 2003, pp. 69-72, XP055469032, https://m.eet.com/media/1136807/302234.pdf [retrieved on Apr. 20, 2018] pp. 69-70, figures 1-2.
Jaanus, M. et al, "Using Microcontrollers for High Accuracy Analogue Measurements", Elektronika Ir Elektrotechnika—Electronics and Electrical Engineering, vol. 19, No. 6, Jun. 12, 2013, pp. 51-54.
McGlinchy, Mike, "Double the Span and Digitize Bipolar Signals Using an HCU's ADC", Electronic Design Europe, Sep. 26, 2012, pp. 1-2.
Mancini, Ron, "Sensor to ADC-analog interface design", Analog and Mixed-Signal Products, Analog Applications Jrl., May 2000, pp. 22-26.

* cited by examiner

SENSING SYSTEM AND METHOD FOR IMPROVING CONTROL OF A SENSOR DETECTION VALUE

CROSS REFERENCE TO RELATED APPLICATION

The present application claims priority to Korean Patent Application No. 10-2017-0068283, filed on Jun. 1, 2017, the entire contents of which is incorporated herein for all purposes by this reference.

BACKGROUND

1. Field of the Disclosure

The present disclosure relates to a sensing system and method, and more particularly, to a sensing system and method capable of improving control of a sensor detection value by improving a resolution of a signal output from a sensor.

2. Description of the Related Art

Typically, a control of a motor in a power train of eco-friendly vehicles including hybrid vehicles, electric vehicles, and fuel cell vehicles is related to the safety of the user as well as the performance of the vehicle. When the motor system of the eco-friendly vehicle deviates from a normal operating condition, the vehicle control is adversely affected and the motor may malfunction. When a sensing signal malfunctions in the vehicle condition in which safety should be considered a malfunction of the motor system occurs. Therefore, a method to effectively process the sensing signal is required.

In particular, an inverter which is a key component for motor control is configured to receive a sensing signal of a three-phase current as an input and uses the received sensing signal for the control. Therefore, when there is an error in the current sensing, the normal motor control is impacted. Accordingly the sensing signal is an important signal item to be managed.

A microcomputer for vehicles includes a controller that provides various operations and commands related to the motor control are configured to receive and process an input signal having a level within a limited range. A sensor is configured to detect a current, and a magnitude in a current within a limited level according to a level within the range processed by the microcomputer. To implement the high output and high performance continuously required in the eco-friendly vehicle, when the specification of the current increases, the current sensor is configured to output a greater detection current range at the level within the range processed by the microcomputer. Accordingly, the resolution of the sensor output signal that represents the detection current is further reduced. As the resolution of the signal output from the sensor decreases, it is difficult to perform the more precise and effective control.

The contents described as the related art have been provided merely for assisting in the understanding for the background of the present disclosure and should not be considered as corresponding to the related art known to those skilled in the art.

SUMMARY

A sensing system and method capable of improving a precision of a control using a sensor detection value by improving a resolution of a signal output from a sensor is provided.

In an aspect of an exemplary embodiment of the present disclosure, a sensing system may include a sensor unit configured to output a voltage having a magnitude that corresponds to a detected physical quantity, an amplification unit configured to amplify a magnitude in the output of the sensor unit to a constant gain, an offset removal unit configured to remove a direct current (DC) offset from an output amplified by the amplification unit to generate a first detection signal, an inversion circuit unit configured to invert the first detection signal to generate a second detection signal and a microcomputer configured to calculate the physical quantity detected by the sensor unit based on the first detection signal and the second detection signal.

In some exemplary embodiments, the sensing system may further include a rectification unit configured to rectify the first detection signal and the second detection signal and adjust the rectified first detection signal and second detection signal to a voltage range recognized by the microcomputer. An amplification gain of the amplification unit may be determined based on a voltage range of the output of the sensor unit and a voltage range recognized by the microcomputer. An amplification gain of the amplification unit may be determined as a value which increases a voltage width that corresponds to about half of the voltage range of the output of the sensor unit as much as a voltage width of the voltage range recognized by the microcomputer.

According to another exemplary embodiment of the present disclosure, a sensing method may include detecting, by a sensor unit, a physical amount and outputting a voltage having a magnitude that corresponds to the physical amount, amplifying, by a controller, the magnitude in the output of the sensor unit to a constant gain, removing, by the controller, a DC offset from the amplified output amplified to generate a first detection signal, inverting, by the controller, the first detection signal to generate a second detection signal and deriving, by the controller, the physical quantity detected by the sensor unit based on the first detection signal and the second detection signal.

In some exemplary embodiments, the sensing method may include rectifying, by the controller, the first detection signal and the second detection signal to adjust the rectified first detection signal and second detection signal to a voltage range recognized by a microcomputer. The amplification, by the controller, may include an amplification gain determined based on a voltage range of the output of the sensor unit and a voltage range recognized by a microcomputer. The amplification gain may be calculated as a value which increases a voltage width that corresponds to about half of the voltage range of the output of the sensor unit as much as a voltage width of the voltage range recognized by the microcomputer.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION

Figure 1:
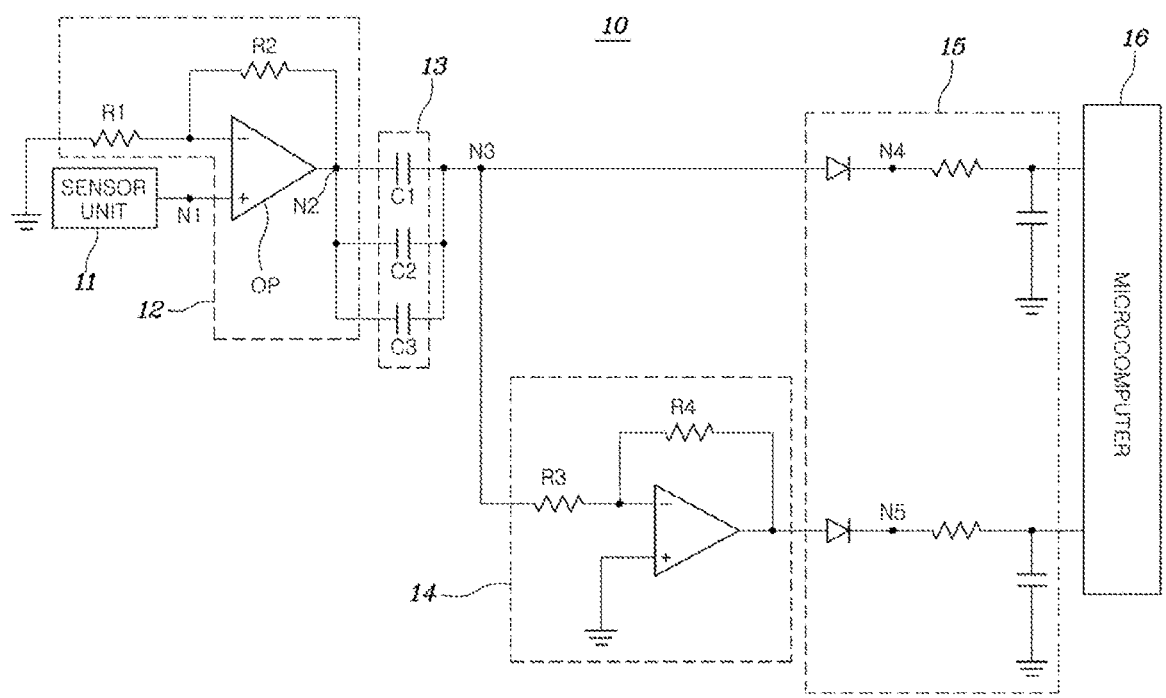
FIG. 1 is an exemplary circuit diagram illustrating a sensing system according to an exemplary embodiment in the present disclosure.

While the disclosure will be described in conjunction with exemplary embodiments, it will be understood that present description is not intended to limit the disclosure to those exemplary embodiments. On the contrary, the disclosure is intended to cover not only the exemplary embodiments, but also various alternatives, modifications, equivalents and other exemplary embodiments, which may be included within the spirit and scope of the disclosure as defined by the appended claims.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/of" includes any and all combinations of one or more of the associated listed items. For example, in order to make the description of the present disclosure clear, unrelated parts are not shown and, the thicknesses of layers and regions are exaggerated for clarity. Further, when it is stated that a layer is "on" another layer or substrate, the layer may be directly on another layer or substrate or a third layer may be disposed there between.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

It is understood that the term "vehicle" or "vehicular" or other similar term as used herein is inclusive of motor vehicle in general such as passenger automobiles including sports utility vehicles (SUV), buses, trucks, various commercial vehicles, watercraft including a variety of boats, ships, aircraft, and the like and includes hybrid vehicles, electric vehicles, combustion, plug-in hybrid electric vehicles, hydrogen-powered vehicles and other alternative fuel vehicles (e.g. fuels derived from resources other than petroleum).

Hereinafter, a sensing system and method according to various exemplary embodiments of the present disclosure will be described with reference to the accompanying drawings. In particular, a sensing system and method for detecting a current applied to a driving motor of a vehicle will be described below as an example of the present disclosure.

FIG. 1 is an exemplary circuit diagram illustrating a sensing system according to an exemplary embodiment in the present disclosure. Referring to FIG. 1, a sensing system 10 may include a sensor unit 11, an amplification unit 12, an offset removal unit 13, an inversion circuit unit 14, a rectification unit 15, and a microcomputer 16. The sensor unit 11 may be configured to detect a specific physical quantity (e.g., a magnitude in current, temperature, pressure, and the like) and output a voltage having a magnitude that corresponds to the detected physical quantity. In particular, a current sensor may be configured to detect a current output from an inverter of a vehicle to the driving motor and a voltage having a magnitude that corresponds to a magnitude in the detected current may be output by the sensor. However, the sensor unit is not limited thereto and may include a plurality of sensors.

When a range of the voltage output from the sensor unit 11 is limited, the entire range of the physical quantity to be detected may displayed using the limited range of voltage. For example, when the current sensor configured to detect a current within a range of approximately −500 to 500 A and output the detected current within an output voltage range of approximately 0 to 5 V, specifications of a motor may be adjusted. Accordingly, a current ranging from about −1000 to 1000 A may be detected. The detected current may be output in an output voltage range of about 0 to 5 V which is a limited range and a detectable resolution may be reduced by about half.

An exemplary embodiment of the present disclosure has been proposed to solve the problem of the resolution reduction. The amplification unit 12 may be configured to amplify the magnitude in the output from the sensor unit 11 to a constant gain. For example, as illustrated in FIG. 1, the amplification unit 12 may include an amplification circuit implemented as an operational amplifier (OP). The amplification unit 12 may use a value of a resistor R1 disposed between the inversion input terminal of the operational amplifier OP and a ground and a value of a resistor R2 disposed between the inversion input terminal of the operational amplifier (OP) and the output terminal of the operational amplifier (OP) to adjust an amplification gain or adjust the amplification gain to a predetermined size.

The offset removal unit 13 may be configured to remove a DC offset from the output amplified by the amplification unit 12 to generate a first detection signal. For example, when the offset removal unit 13 includes at least one capacitor or as illustrated in FIG. 1, a plurality of capacitors connected in parallel to each other, the capacity of the capacitor may be increased to decrease impedance. Accordingly, a frequency range may extend and frequency characteristics (response) may be improved.

The inversion circuit unit 14 may be configured to invert the output that the DC offset is removed from (e.g., the first detection signal) to generate a second detection signal. For example, the inversion circuit unit 14 may be implemented as an inverting amplifier circuit which is implemented as the operational amplifier having a grounded non-inversion input terminal.

The rectification unit 15 may be configured to rectify the first detection signal and the second detection signal to adjust the first detection signal and the second detection signal to the voltage range recognized by the microcomputer 16. For example, as illustrated in FIG. 1, the rectification unit 15 may include a diode disposed between the offset removal unit 13 and the microcomputer 16 and between the inversion circuit unit 14 and the microcomputer 16 in the forward direction. The first and second detection signals may each be applied to the microcomputer 16 after negative voltage values thereof are removed by the diode. The rectification unit 15 may selectively include a low pass filter (LPF) that may be configured to remove a noise component (e.g., a high frequency component) from the first detection signal and the second detection signal.

The microcomputer 16 may be configured to calculate the physical quantity detected by the sensor unit 11 based on the first detection signal and the second detection signal. For example, the microcomputer 16 may be configured to derive the physical quantity that corresponds to the magnitude in the voltage of the first detection signal and the second detection signal, (e.g., the magnitude in the detection current) and operating the motor and the like based on the derived magnitude in the detection current.

Figure 2:
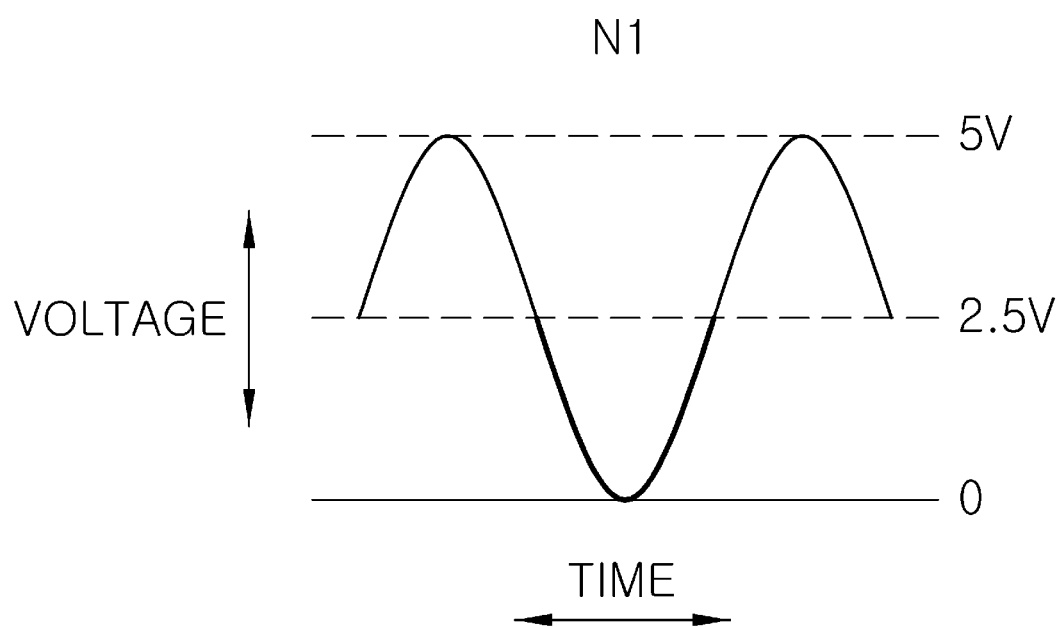
FIGS. 2 to 5 are exemplary diagrams illustrating signals converted in the sensing system according to the exemplary embodiment of the present disclosure illustrated in FIG. 1.

FIGS. 2 to 5 are exemplary diagrams illustrating signals converted in the sensing system according to the exemplary embodiment of the present disclosure illustrated in FIG. 1. FIG. 2 illustrates a signal at a node N1 of FIG. 1. The node N1 may correspond to an output waveform of the sensor unit 11. As illustrated in FIG. 2, the sensor unit 11 may be configured to sense a current and output the voltage that corresponds to the magnitude in the sensed current as, a voltage of about 0 to 5 V.

Figure 3:
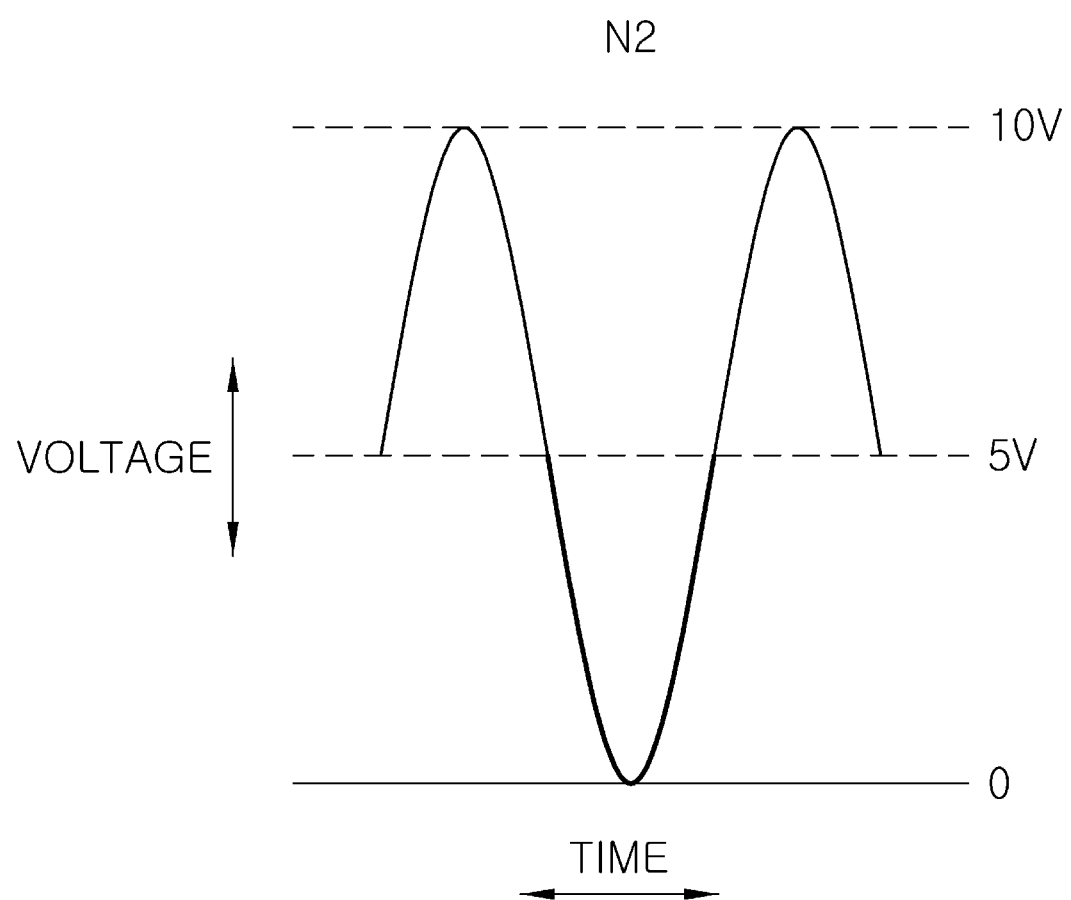

FIG. 3 illustrates a signal at a node N2 of FIG. 1. The node N2 may correspond to an output waveform of the amplification unit 12. As illustrated in FIG. 3, the amplification unit 12 may be configured to amplify the voltage that corresponds to the magnitude in the current sensed by the sensor unit to a voltage of about 0 to 10 V.

For example, the amplification gain of the amplification unit 12 may be determined based on the voltage range of the output of the sensor unit 11 and the voltage range recognized by the microcomputer 16. More specifically, the amplification gain of the amplification unit 12 may be determined as a value at which the voltage width corresponding to about half of the voltage range of the output of the sensor unit 11 and the voltage width of the voltage range recognized by the microcomputer 16 may be substantially the same. For example, as illustrated in FIG. 2, when the output voltage sensed by the sensor unit 11 ranges from about 0 to 5 V and the preset voltage range recognized the microcomputer may range from about 0 to 5 V. The amplification gain of the amplification unit 12 may be determined as a value which amplifies a voltage width (e.g., amplitude of the voltage) of about 2.5 V that corresponds to about ½ of the voltage range of the output of the sensor unit 11 to a voltage width of about 5V that corresponds to a voltage width of the voltage range recognized by the microcomputer 16, that is, a voltage width of about 5V that may correspond to about 0 to 5V. Accordingly, the amplification gain may be about 2.

Figure 4:
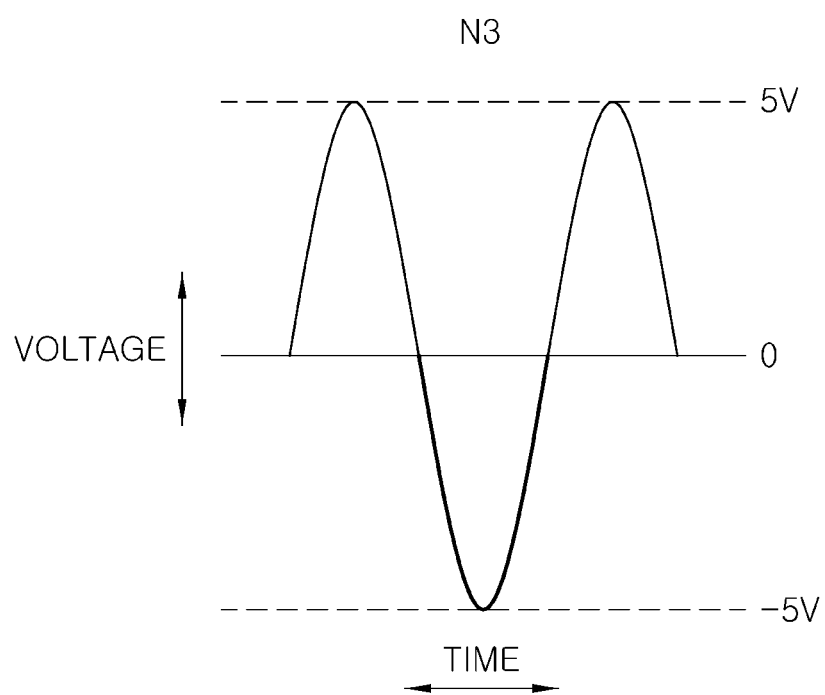

Next, FIG. 4 illustrates a signal at a node N3 of FIG. 1. The node N3 may correspond to an output waveform of the offset removal unit 13. As illustrated in FIG. 4, when the offset removal unit 13 removes the offset that corresponds to the DC component of the voltage amplified by the amplification unit 12, a signal having the same amplitude in a positive (+) direction and a negative (−) direction with respect to 0 V may be generated. For example, as illustrated in FIG. 3, when a DC offset component that corresponds to about 5 V is removed from a signal swinging between about 0 and 10 V, a signal swinging between about −5 V and −5 V with respect to 0 V may be generated. In other words, the signal of FIG. 4 may correspond to the first detection signal.

Figure 5:
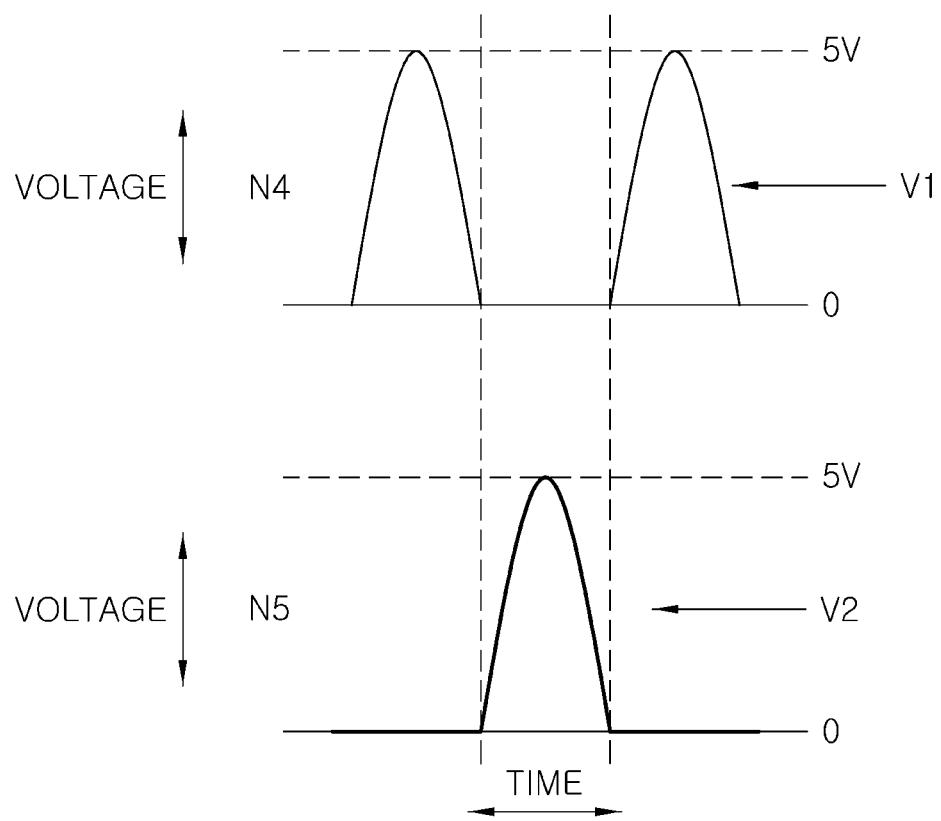

FIG. 5 illustrates signals at a node N4 and a node N5 of FIG. 1. In FIG. 5, reference numeral 'V1' represents a signal at a node N4, and reference numeral 'V2' represents a signal at a node N5. As illustrated in FIG. 5, the form of the signal of the node N4 has a form in which the negative component is blocked by the diode connected in the forward direction in the signal illustrated in FIG. 4. In other words, an output waveform of the node N4 may take a form of a voltage of about 0 to 5 V appearing periodically.

In addition, an output waveform of the node N5 is a signal generated by rectifying the second detection signal using the diode, in which the second detection signal may be obtained by inverting the first detection signal using the inversion circuit unit 14. Since the second detection signal is the signal obtained by inverting the first detection signal, a negative value having the same absolute value may be within a range where the first detection signal has a positive value and a positive value having the same absolute value may be within a range where the first detection signal has a negative value. Accordingly, when the second detection signal is rectified, a portion that corresponds to the negative value of the first detection signal may be a positive value.

The microcomputer 16 may be configured to receive the two detection signals and may be configured to calculate a detection value that corresponds to the voltage level of the corresponding detection signal to perform the required calculation and control. Although the microcomputer 16 receives two detection signals through two input terminals, respectively, the two detection signals may not have a voltage level at the same point in time. Therefore, the calculation or the control may be performed based on the voltage level of the detection signal input to each of them.

As described above, the sensing system 10 according to the exemplary embodiment of the present disclosure may increase the width of the level of the voltage output from the sensor by applying the signal conversion processes such as amplification, offset removal, and inversion to the signal output from the sensor, thereby increasing the resolution of the detection signal input to the microcomputer 16. In other words, when the range of the physical quantity detected by the sensor unit 11 increases, the width of the voltage detecting detected may increase and the increased range of the physical quantity may be displayed. Accordingly, when the sensing system 10 according to the exemplary embodiment of the present disclosure is applied, the precision of the control may be improved by providing a more accurate detection quantity to the microcomputer in response to the improvement in the resolution.

Figure 6:
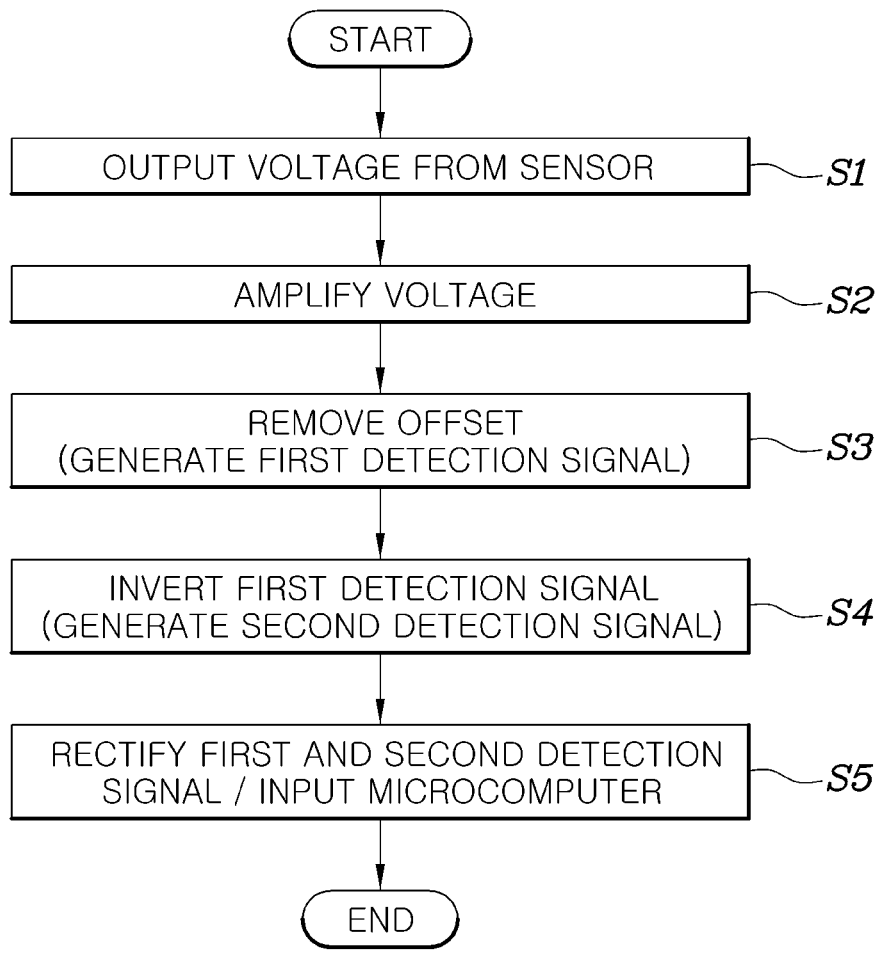
FIG. 6 is an exemplary flowchart illustrating a sensing method by the sensing system according to the exemplary embodiment of the present disclosure illustrated in FIG. 1.

FIG. 6 is an exemplary flowchart illustrating a sensing method by the sensing system according to the exemplary embodiment of the present disclosure illustrated in FIG. 1. Referring to FIG. 6, the sensing method may include detecting, by the sensor unit 11, a specific physical quantity (e.g., a magnitude in current, temperature, pressure, and the like) and outputting the voltage having the magnitude that corresponds to the detected physical quantity (S1).

The amplification unit 12 may be configured to amplify the magnitude in the output from the sensor unit 11 to a constant gain (S2). For example, the amplification gain of the amplification unit 12 may be determined based on the voltage range that may be output by the sensor unit 11 and the voltage range that may be recognized by the microcomputer 16. More specifically, the amplification gain of the amplification unit 12 may be determined as a value at which the voltage width that corresponds to a half of the voltage range that may be output by the sensor unit 11 and the voltage width of the voltage range that may be recognized by the microcomputer 16 which may be substantially the same.

The offset removal unit 13 may be configured to remove a DC offset from the output amplified by the amplification unit 12 to generate a first detection signal (S3). Thereafter, the inversion circuit unit 14 may be configured to invert the first detection signal to generate the second detection signal (S4). Thereafter, the rectification unit 15 may be configured to rectify the first and second detection signals and adjust the rectified first and second detection signals to the input voltage range of the microcomputer 16, remove the noise through the LPF, and provide signals that correspond to each of the plurality of ports of the microcomputer 16 (S5). Thereafter, the microcomputer 16 may be configured to calculate the physical quantity detected by the sensor unit 11 based on the first and second detection signals, and may be configured to operate the motor or the like based on the magnitude in the calculated detection current.

As described above, the exemplary embodiment of the present disclosure may improve the resolution of the voltage signal output as the result value detected by the sensor configured to detect the specific physical quantity and improve the precision of the control using the value detected by the sensor. In particular, when the exemplary embodiment of the present disclosure is applied to the driving motor control of the vehicle, the precision of the control of the driving motor may be improved by increasing the resolution of the signal output from the current sensor for detecting the current supplied to the driving motor and the driving performance and the fuel efficiency of the vehicle may be improved by the enhanced precision of the control of the vehicle motor.

According to the sensing system and method, when the precision of the control using the value detected by the sensor is improved the resolution of the voltage signal output as the result value detected by the sensor that detects the specific physical quantity may be improved. In particular, when the sensing system and method are applied to the driving motor control of the vehicle, the precision of the control of the driving motor may be improved by increasing the resolution of the signal output from the current sensor for detecting the current supplied to the driving motor and the driving performance and the fuel efficiency of the vehicle may be improved by the enhanced precision of the control of the vehicle motor. Further, even when the sensing system and method are applied to the current sensing of other control devices of the vehicle including the on-board charger (OBC), the converter, or the like of the vehicle, the controllability of each control device may be improved.

Although the present disclosure has been shown and described with respect to exemplary embodiments, it will be obvious to those skilled in the art that the present disclosure may be variously modified and altered without departing from the spirit and scope of the present disclosure as defined by the following claims.

What is claimed is:

1. A sensing system, comprising:
a sensor unit configured to output a voltage having a magnitude that corresponds to a detected physical quantity;
an amplification unit configured to amplify the magnitude in the output of the sensor unit by a constant gain;
an offset removal unit configured to remove a direct current (DC) offset from an output amplified by the amplification unit to generate a first detection signal;
an inversion circuit unit configured to invert the first detection signal to generate a second detection signal; and
a microcomputer configured to receive the first detection signal and the second detection signal as inputs,
wherein the amplification gain of the amplification unit is calculated as a value which increases a voltage width that corresponds to about half of the voltage range of the output of the sensor unit as much as a voltage width of the voltage range recognized by the microcomputer.

2. The sensing system of claim 1, further comprising:
a rectification unit configured to rectify the first detection signal and the second detection signal and adjust change the rectified first detection signal and second detection signal to a voltage range recognized by the microcomputer.

3. A sensing method, comprising:
detecting, by a sensor unit, a physical amount and outputting to a controller a voltage having a magnitude corresponding to the physical amount;
amplifying, by an amplification unit, the magnitude in the output of the sensor unit by a constant gain;
removing, by an offset removal unit, a direct current (DC) offset from the amplified output that is amplified to generate a first detection signal which is input to a microcomputer;
inverting, by an inversion circuit unit, the first detection signal to generate a second detection signal which is input to the microcomputer; and
deriving, by the controller, the physical quantity detected by the sensor unit based on the first detection signal and the second detection signal,
wherein the amplification gain is calculated as a value which increases a voltage width that corresponds to about half of the voltage range of the output of the sensor unit as much as a voltage width of the voltage range recognized by a microcomputer.

4. The sensing method of claim 3, further comprising:
rectifying, by a rectification unit, the first detection signal and the second detection signal to adjust the rectified first detection signal and second detection signal to a voltage range recognized by the controller.

* * * * *